United States Patent
Nobutoki et al.

(10) Patent No.: US 7,436,720 B2
(45) Date of Patent: Oct. 14, 2008

(54) SEMICONDUCTOR MEMORY DEVICE

(75) Inventors: Tomoko Nobutoki, Tokyo (JP); Kyoichi Nagata, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 20 days.

(21) Appl. No.: 11/605,309

(22) Filed: Nov. 29, 2006

(65) Prior Publication Data

US 2007/0127301 A1 Jun. 7, 2007

(30) Foreign Application Priority Data

Dec. 2, 2005 (JP) ............................. 2005-348643

(51) Int. Cl.
*G11C 7/00* (2006.01)

(52) U.S. Cl. .................. 365/202; 365/190; 365/207

(58) Field of Classification Search ............... 365/202, 365/190, 207, 51, 189.07, 191, 208, 185.23, 365/185.13

See application file for complete search history.

(56) References Cited

U.S. PATENT DOCUMENTS 5,136,543 A * 8/1992 Matsuda et al. ............. 365/190

2003/0193824 A1 * 10/2003 Tsukikawa et al. .......... 365/149

FOREIGN PATENT DOCUMENTS

| JP | 63-148489 | 6/1988 |
|----|-----------|--------|
| JP | 7-58587 B2 | 6/1995 |
| JP | 9-147597 A | 6/1997 |
| JP | 2002-319299 A | 10/2002 |
| JP | 2002-343094 A | 11/2002 |

* cited by examiner

*Primary Examiner*—Dang T Nguyen
(74) *Attorney, Agent, or Firm*—McDermott Will & Emery LLP

(57) ABSTRACT

A semiconductor memory device includes plates accessed by different row addresses and a sense amplifier column between the adjacent plates. The sense amplifier column is a mixture of configurations, one in which one of the pair of bit lines is twisted, and another in which neither of the pair of bit lines is twisted. If an address analysis indicates that there is an access through an input/output wiring, input/output data is not inverted. If the address analysis indicates that there is an access through another input/output wiring and that it is an access to a plate, the input/output data is not inverted, while if it is an access to another plate, the input/output data is inverted.

6 Claims, 9 Drawing Sheets

|  | MIOT_1i (MIODT_1i) | MIOT_1j (MIODT_1j) | MIOT_0i (MIODT_0i) | MIOT_0j (MIODT_0j) |
|---|---|---|---|---|
| RODDT | NOT INVERT | NOT INVERT | INVERT | NOT INVERT |
| REVENT | INVERT | NOT INVERT | NOT INVERT | NOT INVERT |

FIG.7

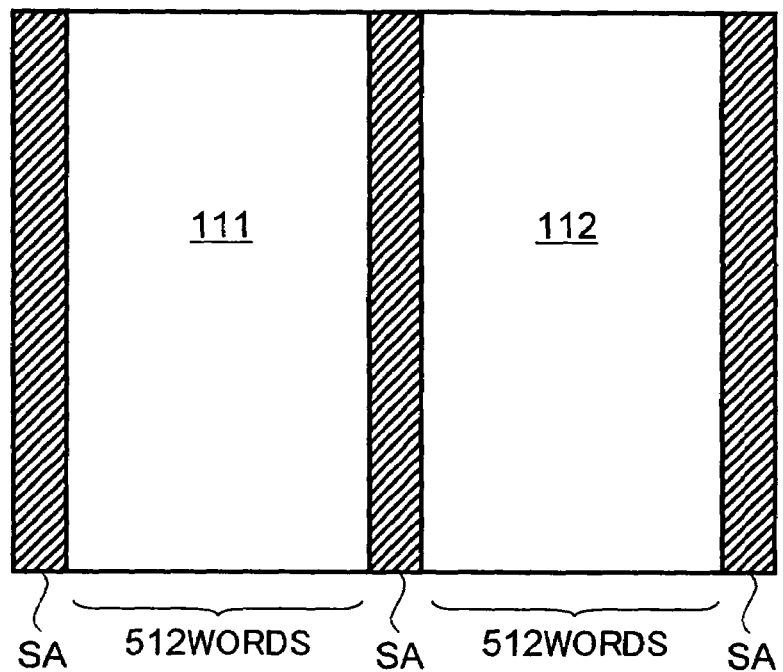
FIG.9 *(PRIOR ART)*
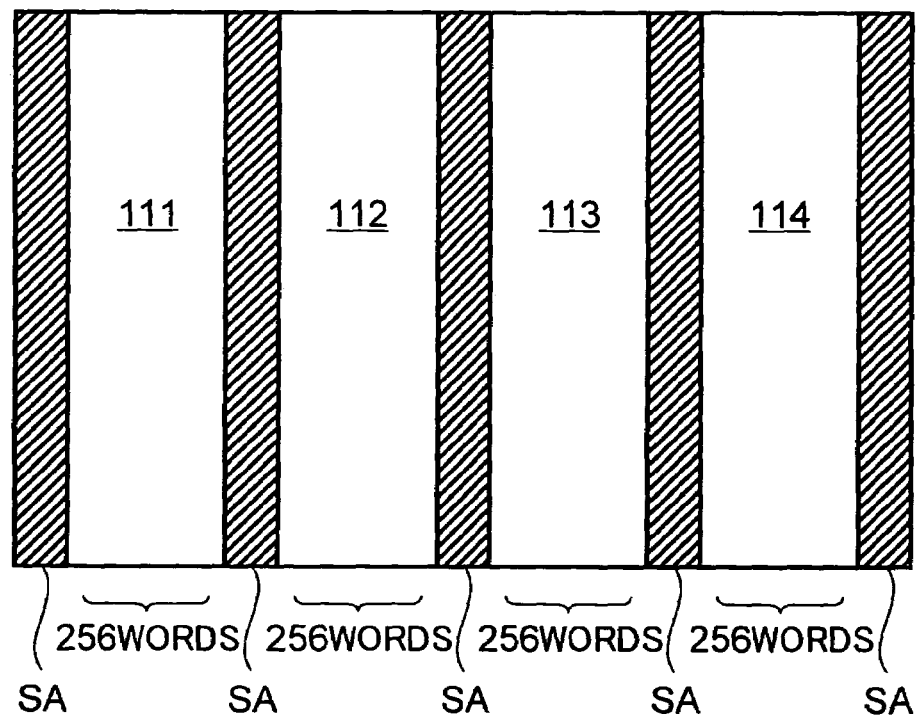
FIG.10

SEMICONDUCTOR MEMORY DEVICE

TECHNICAL FIELD

The present invention relates to a semiconductor memory device, and more particularly relates to a semiconductor memory device having corrected address data topology.

BACKGROUND OF THE INVENTION

A storage capacity of a semiconductor memory device represented by a DRAM (Dynamic Random Access Memory) has yearly increased and there is a demand for acceleration of the semiconductor memory device. To realize high-speed operation of the DRAM, it is essential to accelerate the speed of a sense amplifier that amplifies a potential difference between a pair of bit lines.

To accelerate the sense speed of the sense amplifier, it is preferable to provide a transfer gate between a bit line of cells and the sense amplifier and to thus make the sense amplifier perform sense operation while not connecting the bit line of the cells to the sense amplifier but separating the cells from the sense amplifier. By doing so, the capacity by which the sense amplifier is to charge or discharge is reduced, so that the sense speed can be accelerated.

On the other hand, due to recent development of miniaturization, the influence of coupled noise between bit lines in the sense amplifier has increased to a level that is no longer negligible. To reduce the coupled noise, the following method is proposed. The bit lines of the sense amplifier, i.e., the paired bit lines located on the sense amplifier side relative to the transfer gate are twisted, thereby canceling the coupled noise.

FIG. 8 is a circuit diagram showing relevant parts of a semiconductor memory device in which the bit lines of the sense amplifier are twisted.

The semiconductor memory device shown in FIG. 8 includes a sense amplifier 10, a first pair of bit lines 21 and 22, a second pair of bit lines 31 and 32. The sense amplifier 10 includes a first input/output terminal 11 and a second input/output terminal 12. The first pair of bit lines 21 and 22 is provided on one side of the sense amplifier 10. The second pair of bit lines 31 and 32 is provided on the other side of the sense amplifier 10. The bit line 21 included in the first pair of bit lines and the bit line 31 included in the second pair of bit lines are connected to the first input/output terminal 11 of the sense amplifier 10 in common. The bit line 22 included in the first pair of bit lines and the bit line 32 included in the second pair of bit lines are connected to the second input/output terminal 12 of the sense amplifier 10 in common.

The sense amplifier 10 has a function of amplifying a potential difference generated between the first and the second input/output terminals 11 and 12. Therefore, the relationship between logic values of the bit lines 21 and 31 connected to the first input/output terminal 11 and a physical level is opposite to that between logic values of the bit lines 22 and 32 connected to the second input/output terminal 12 and a physical level. Due to this, if the bit lines 21 and 31 are defined as "non-inverted bit lines", the bit lines 22 and 32 can be defined as "inverted bit lines".

The first pair of bit lines 21 and 22 is connected to the sense amplifier 10 through first and second transfer gates 41 and 42, respectively. The second pair of bit lines 31 and 32 is connected to the sense amplifier 10 through third and fourth transfer gates 43 and 44, respectively. The first and the second transfer gates 41 and 42 are turned on or off in response to a same signal T0 whereas the third and the fourth transfer gates 43 and 44 are turned on or off in response to a same signal T1.

As shown in FIG. 8, the first pair of bit lines 21 and 22 is connected to the sense amplifier 10 without being twisted with each other between the transfer gates 41 and 42 and the sense amplifier 10. On the other hand, the second pair of bit lines 31 and 32 is connected to the sense amplifier 10 while being twisted with each other between the transfer gates 43 and 44 and the sense amplifier 10. Due to this, the positional relationship between the bit lines 21 and 22 (the positional relationship between the non-inverted bit line and the inverted bit line) is opposite to that between the bit lines 31 and 32 (the positional relationship between the non-inverted bit line and the inverted bit line).

The twisted portion is provided to cancel the coupled noise between the bit lines in the sense amplifier (between the transfer gates 41 and 42 and the transfer gates 43 and 44).

However, if the twisted portion is provided, the first pair of bit lines 21 and 22 differs from the second pair of bit lines 31 and 32 in address data topology, which disadvantageously complicates the address data topology of the overall semiconductor memory device.

Specifically, when attention is paid to two word lines 51 and 52 intersecting the first pair of bit lines 21 and 22 and two word lines 53 and 54 intersecting the second pair of bit lines 31 and 32, memory cells 61 and 63 are arranged at the intersection between the upper bit lines 21 and 32 with respect to the word lines 51 and 53, while memory cells 62 and 64 are arranged at the intersection between the lower bit lines 22 and 31 with respect to the wordlines 52 and 54. As a result, although being arranged at positions corresponding to each other, the memory cells 61 and 63 (62 and 64) store therein the same logic value at different physical levels (potentials). For example, if it is necessary to store a logic value "1" in the memory cell 61 and store a high-level potential in the memory cell 61, it is necessary to store a low-level potential in the memory cell 61 when the memory cell 63 stores therein the logic value "1".

There is no need for a user to recognize such complication of the address data topology when the user actually uses the semiconductor memory device. However, if a screening test for which it is necessary to actually recognize physical levels stored in the respective memory cells is conducted, a function exceeding the limit of the function of a tester for the screening test is often required. As a result, a conventional tester sometimes cannot be used for the test.

This disadvantage is conspicuous particularly if the number of memory cells connected to the first pair of bit lines 21 and 22 or the second pair of bit lines 31 and 32 differs from $n^{th}$ power of 2. This disadvantage will be described below.

As shown in FIG. 9, a memory mat including 1024 ($=2^{10}$) word lines will be considered. If the memory mat is divided into two plates 111 and 112, 512 ($=2^9$) word lines are allocated to each of the plates 111 and 112. In this case, the number of sense amplifier columns SAs is three. If one memory mat is divided into two plates, the length of each bit line is halved and read operation can be, therefore, accelerated.

To further accelerate the read operation, a memory mat including 1024 ($=2^{10}$) word lines is divided into four plates 111 to 114 as shown in FIG. 10. In this case, the number of word lines allocated to each plate is 256 ($=2^8$), thereby further reducing the length of each bit line. However, if the memory mat is divided into four plates, the number of sense amplifier columns SAs increases to five, thereby disadvantageously deteriorating integration.

In this way, if the memory mat is divided into a plurality of plates, the read operation can be accelerated due to reduction in the length of each bit line, but at the same time, the integration deteriorates due to increase in the number of sense amplifier columns SAs. Considering this point, it is quite often optimum to set the number of word lines allocated to each plate to the $n^{th}$ power of 2 ($=2^n$) so as to simultaneously realize acceleration and high integration. In this case, as shown in FIG. 11, it is often necessary to divide a memory mat into, for example, three plates 111 to 113. If the memory mat is divided into the three plates 111 to 113, the numbers of word lines allocated to the respective plates are 344, 336, and 344, which differ from the $n^{th}$ power of 2.

If the numbers of word lines allocated to the respective plates differ from the $n^{th}$ power of 2, the boundary of a row address ranging over the sense amplifiers disadvantageously becomes unclear. Namely, if the number of word lines allocated to each plate is the $n^{th}$ power of 2 (see FIGS. 9 and 10), it is possible to easily grasp to which plate a row address corresponds by referring only to a few high bits of the row address. As a result, even if the address data topology is slightly complicated, it is not so difficult to conduct a screening test or the like by considering the complicated address data topology.

More specifically, as shown in FIG. 9, if the number of word lines allocated to each plate is 512 ($=2^9$), each plate can be identified without the need to refer to lower nine bits of the row address. Furthermore, as shown in FIG. 10, if the number of word lines allocated to each plate is 256 ($=2^8$), each plate can be identified without the need to refer to lower eight bits of the row address. As a result, as shown in FIG. 8, even if the address data topology is slightly complicated due to the twisted bit lines, it is not so difficult to correct the address data topology using the tester.

On the other hand, if the number of word lines allocated to each plate is not the $n^{th}$ power of 2 as shown in FIG. 11, it is necessary to refer to not only a few high bits but also many low bits of the row address so as to identify each plate. As a result, it is difficult to correct the complicated address data topology due to the twisted bit lines using the tester. For these reasons, if the number of word lines allocated to each plate is not the $n^{th}$ power of 2, i.e., if the number of memory cells connected to the first pair of bit lines 21 and 22 or the second pair of bit lines 31 and 32 shown in FIG. 8 differs from the $n^{th}$ power of 2, then the complicated address data topology due to the twisted bit lines greatly affects the screening test or the like, and it is sometimes necessary to employ a new tester.

SUMMARY OF THE INVENTION

The present invention has been achieved to solve the conventional disadvantages. It is an object of the present invention to provide an improved semiconductor memory device with a configuration in which bit lines are twisted in a sense amplifier.

It is another object of the present invention to provide a semiconductor memory device that can easily conduct a screening test or the like by internally correcting address data topology.

The above and other objects of the present invention can be accomplished by a semiconductor memory device comprising:

a first pair of bit lines including a non-inverted bit line and an inverted bit line that can be selected by a row address in a first range;

a second pair of bit lines including a non-inverted bit line and an inverted bit line that can be selected by a row address in a second range that is not overlapping the first range;

a sense amplifier provided to be common to the first pair of bit lines and the second pair of bit lines; and an address-data-topology correcting unit supplying write data and outputting read data to/from the first pair of bit lines without inverting and supplying write data and outputting read data to/from the second pair of bit lines with inverting, wherein a positional relationship between the non-inverted bit line and the inverted bit line in the first pair of bit lines is opposite to a positional relationship between the non-inverted bit line and the inverted bit line in the second pair of bit lines.

According to the present invention, data input or output through the second pair of bit lines is inverted. Due to this, it appears that the address data topology of the first pair of bit lines is the same as that of the second pair of bit lines. Namely, the complication of the address data topology is corrected within the semiconductor memory device. As a result, even if it is necessary to actually recognize the physical level stored in each memory cell during the screening test or the like, the physical level stored in each memory cell can be easily controlled.

One or both of the number of memory cells connected to the first pair of bit lines and that connected to the second pair of bit lines often differ from the numbers that can be expressed as the $n^{th}$ power of 2. Furthermore, the number of memory cells connected to the first pair of bit lines often differs from that connected to the second pair of bit lines. Even if the address data topology of the semiconductor memory device is thus complicated, it appears from outside that the address data topology is simple.

In this manner, the semiconductor memory device according to the present invention corrects the address data topology within the semiconductor memory device. The screening test or the like can be, therefore, easily conducted. As a consequence, even if the number of word lines allocated to each plate differs from the $n^{th}$ power of 2, the conventional tester can be employed for the screening test or the like. It is, therefore, possible to suppress increase of manufacturing cost.

BRIEF DESCRIPTION OF THE DRAWINGS

The above and other objects, features and advantages of this invention will become more apparent by reference to the following detailed description of the invention taken in conjunction with the accompanying drawings, wherein:

FIG. 7 is a table for explaining data inverting operation performed by the address-data-topology correcting unit;

FIG. 9 is a schematic diagram of a memory mat that is divided into two plates;

FIG. 10 is a schematic diagram of a memory mat that is divided into four plates.

DETAILED DESCRIPTION OF THE EMBODIMENTS

Preferred embodiments of the present invention will now be explained in detail with reference to the drawings.

Figure 1:
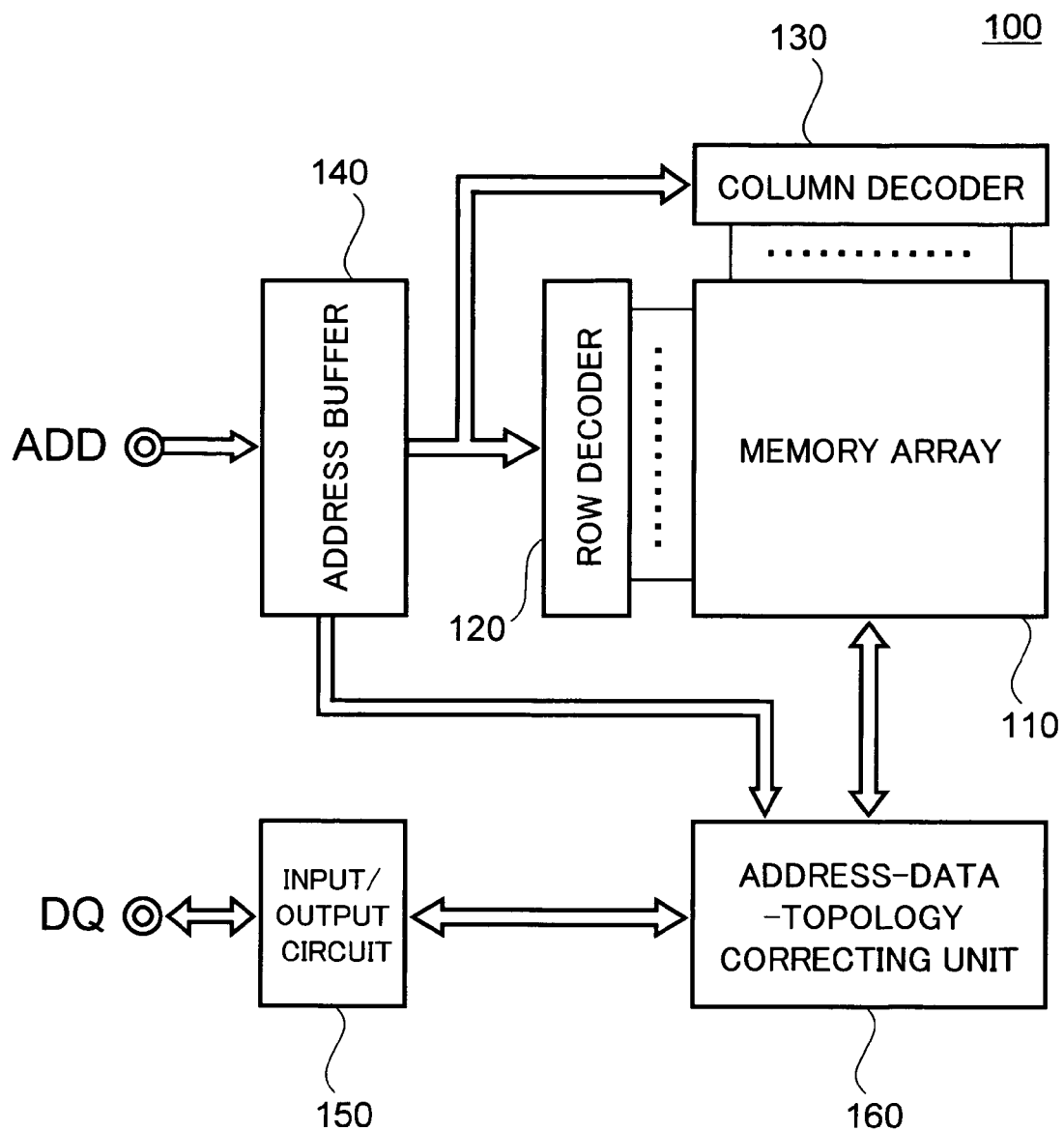
FIG. 1 is a schematic block diagram of a configuration of a semiconductor memory device according to a preferred embodiment of the present invention.

FIG. 1 is a schematic block diagram of a configuration of a semiconductor memory device 100 according to a preferred embodiment of the present invention.

As shown in FIG. 1, a semiconductor memory device 100 according to the embodiment of the present invention includes a memory array 110, a row decoder 120, a column decoder 130, an address buffer 140, an input/output circuit 150, and an address-data-topology correcting unit 160. A row address is supplied to the row decoder 120. A column address is supplied to the column decoder 130. The address buffer 140 supplies the row address and the column address to the row decoder 120 and the column decoder 130, respectively. The input/output circuit 150 inputs and outputs data. The address-data-topology correcting unit 160 corrects the address data topology of the memory array 110.

Figure 11:
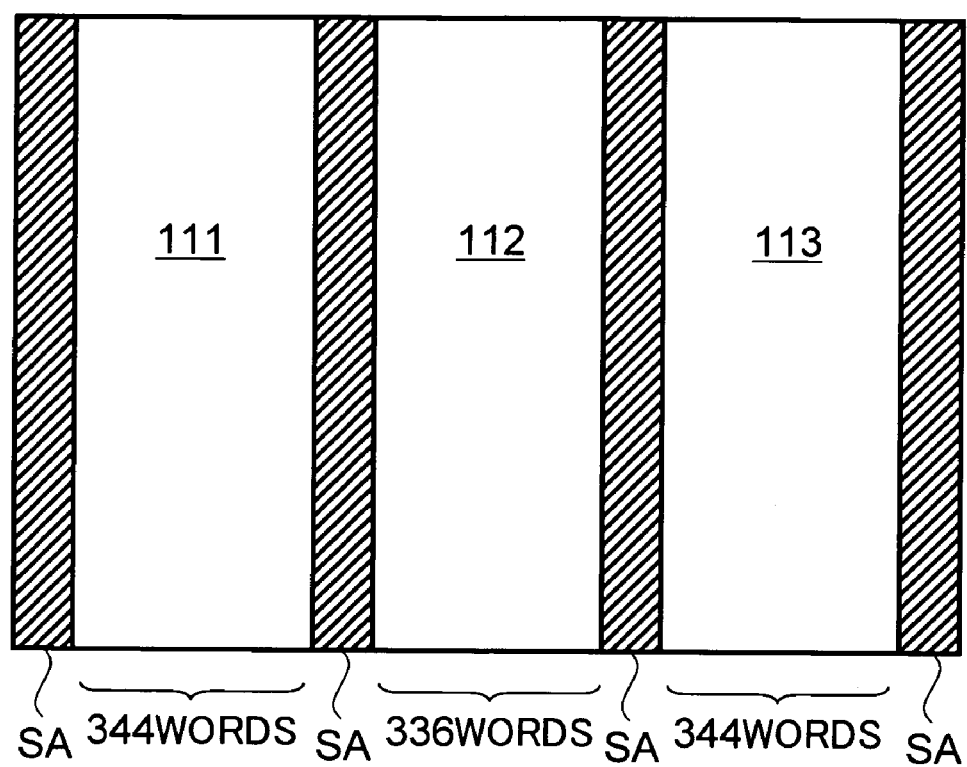
FIG. 11 is a schematic diagram of a memory mat that is divided into three plates.

The memory array 110 includes a plurality of memory mats. In the present embodiment, each memory mat is configured as shown in FIG. 11. Namely, each memory mat to which 1024 (=$2^{10}$) word lines are allocated is divided into the three plates. The numbers of word lines allocated to the plates are, for example, 344, 336, and 344, respectively. Accordingly, the number of word lines allocated to each plate, i.e., the number of memory cells connected to one pair of bit lines differs from the $n^{th}$ power of 2. Besides, the numbers of word lines allocated to the adjacent plates differ from each other.

Figure 2:
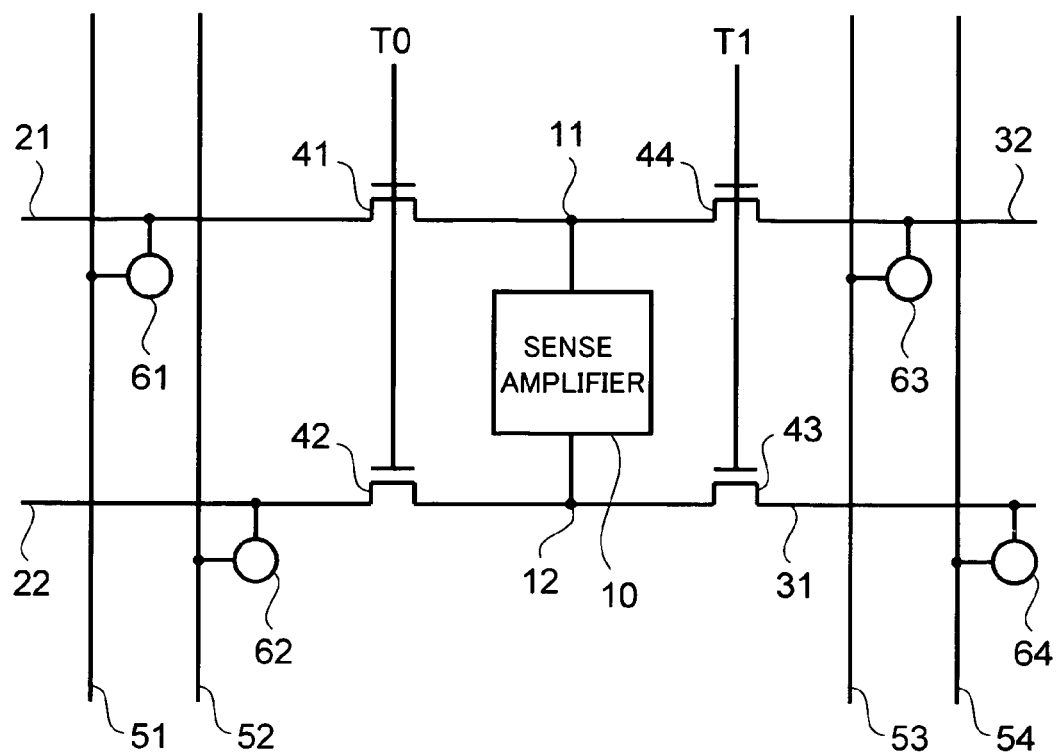
FIG. 2 is a circuit diagram showing relevant parts of a semiconductor memory device in which the bit lines of the sense amplifier are not twisted.
Figure 8:
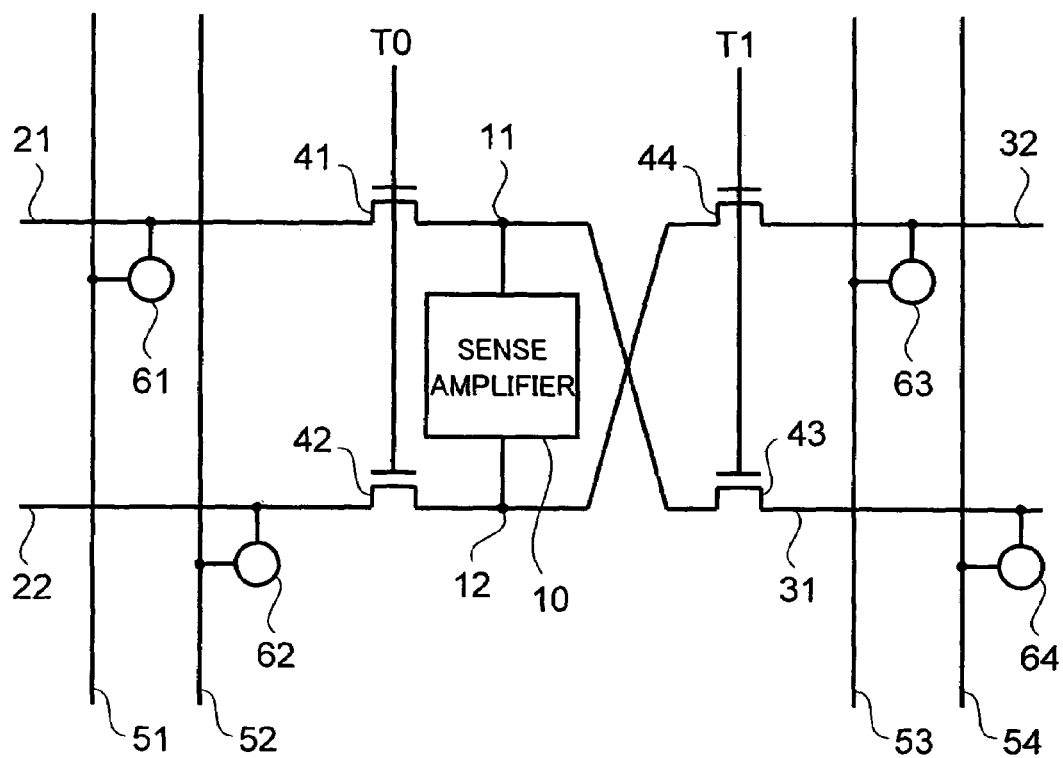
FIG. 8 is a circuit diagram showing relevant parts of a semiconductor memory device in which the bit lines of the sense amplifier are twisted.

The configuration of bit lines connected to each sense amplifier is a mixture of the configuration shown in FIG. 8 and that shown in FIG. 2. The configuration shown in FIG. 2 is the same as that shown in FIG. 8 in that the first pair of bit lines 21 and 22 and the second pair of bit lines 31 and 32 are connected to one sense amplifier 10, and in that the first pair of bit lines 21 and 22 and the second pair of bit lines 31 and 32 are connected to the sense amplifier 10 through the first to the fourth transfer gates 411 and 44, respectively. The configuration shown in FIG. 2, however, differs from that shown in FIG. 8 in that the pair of bit lines is not twisted in the sense amplifier (between the transfer gates 41 and 42 and the transfer gates 43 and 44).

In the configuration shown in FIG. 8, the second pair of bit lines 31 and 32 intersects with each other between the transfer gates 43 and 44 and the sense amplifier 10. As already described, the reason is to cancel the coupled noise generated between the bit lines in the sense amplifier 10 (between the transfer gates 41 and 42 and the transfer gates 43 and 44).

Two types of configurations are mixed so as to eliminate the influence of bit lines connected to the other sense amplifiers and to cancel the coupled noise between the bit lines in each sense amplifier column as a whole. The mixture configuration is effective when a nested configuration in which the other bit lines are arranged between the paired bit lines is adopted.

The address-data-topology correcting unit 160 is a circuit that inverts data input or output to or from the pair of twisted bit lines (the second pair of bit lines 31 and 32 shown in FIG. 8) in the sense amplifier. As already described, the configuration of the bit lines connected to the sense amplifier 10 is a mixture of two types of configurations. According to one type of configuration (shown in FIG. 8), one pair of bit lines is not twisted with each other whereas the other pair of bit lines is twisted with each other. Due to this, if the pair of twisted bit lines is accessed, the address-data-topology correcting unit 160 needs to invert the data input or output to or from the pair of twisted bit lines. On the other hand, if the pair of untwisted bit lines is accessed, the address-data-topology correcting unit 160 does not invert the data input or output to or from the bit lines. Likewise, in the configuration shown in FIG. 2, if the bit lines connected to the sense amplifier are accessed, the address-data-topology correcting unit 160 does not invert the data input or output to or from the bit lines.

It is possible to determine whether an access-requested memory cell is connected to the bit line twisted with the paired bit line or connected to the bit line untwisted with the paired bit line by referring to the row address and the column address of the memory cell. In the present embodiment, the number of word lines allocated to each plate is not the $n^{th}$ power of 2. Due to this, the lowest row address of the memory cell among the memory cells connected to the bit line 21 or 22 of the first pair and the lowest row address of the memory cell among the memory cells connected to the bit line 31 or 32 of the second pair differ in a logic value by two bits or more.

The difference indicates that the above determination cannot be made unless many bits of each address of the memory cell are referred to. As a result, the determination becomes difficult depending on the function of an external unit such as a tester. According to the present embodiment, by contrast, it is determined whether the access-request memory cell is connected to one of the pair of twisted bit lines or one of the pair of untwisted bit lines by analyzing the address of the memory cell in the semiconductor memory device. Furthermore, the input or output data is inverted based on the determination result. The address 6 data topology of the semiconductor memory device, therefore, appears quite simple from the outside.

Figure 3:
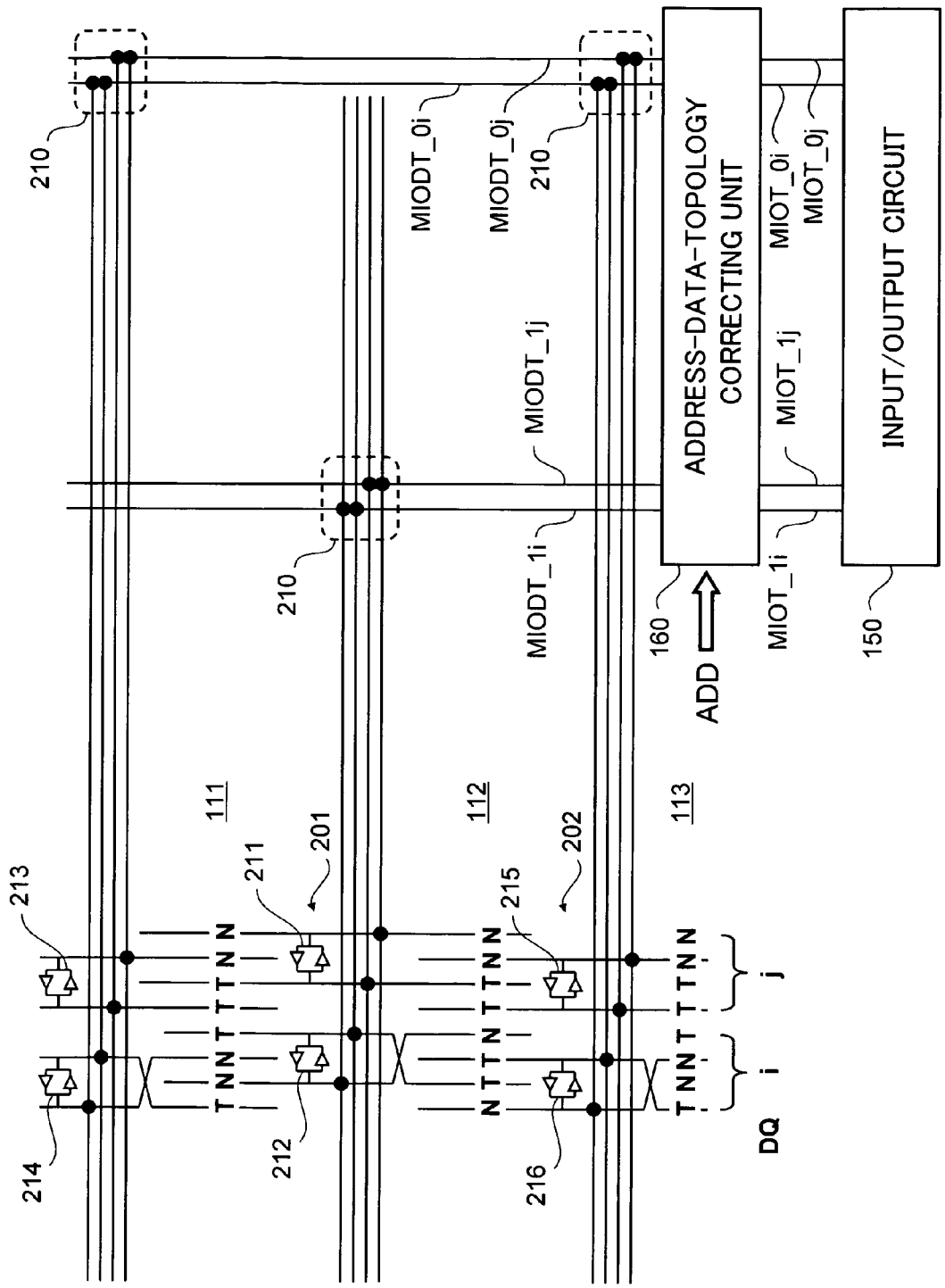
FIG. 3 is a detailed view of the configuration of relevant parts of the semiconductor memory device shown in FIG. 1.

FIG. 3 is a detailed view of the configuration of relevant parts of the semiconductor memory device 100 shown in FIG. 1. In FIG. 3, a part of the plates 111 to 113 shown in FIG. 11 are enlarged and no transfer gates are shown. As already described, the plates 111 to 113 are accessed by different row addresses.

As shown in FIG. 3, a sense amplifier column 201 is provided between the plates 111 and 112, and a sense amplifier column 202 is provided between the plates 112 and 113. The configuration of the bit lines connected to each of the sense amplifier columns 201 and 202 is the mixture of the configuration in which one pair of bit lines is twisted (see FIG. 8) with each other and the configuration in which neither of the pairs of bit lines is twisted (see FIG. 2). The sense amplifier of a configuration in which one pair of twisted bit lines is connected corresponds to predetermined bits i of input or output data DQ, and that to which the pairs of untwisted bit lines are connected corresponds to predetermined bits j of the input or output data DQ.

As for the sense amplifier to which the pairs of untwisted bit lines are connected, e.g., a sense amplifier 211 shown in FIG. 3, there is no need to invert the input or output data whether the plate 111-side memory cell is accessed or the plate 112-side memory cell is accessed.

As for the sense amplifier to which one pair of twisted bit lines is connected, e.g., a sense amplifier 212 shown in FIG. 3, if the plate 111-side memory cell is accessed, it is unnecessary to invert the input or output data. Furthermore, if the plate 112-side memory cell is accessed, it is necessary to invert the input or output data.

Input/output terminals of the sense amplifier 211 are connected to a pair of local wirings LIOT_1j and LION_1j, respectively and connected to an input/output wiring MIODT_1j in a crossing area 210. Likewise, input/output terminals of the sense amplifier 212 are connected to a pair of local wirings LIOT_1i and LION_1i, respectively and connected to an input/output wiring MIODT_1i in the crossing area 210.

Therefore, if the address analysis indicates that there is an access through the input/output wiring MIODT_1j, the address-data-topology correcting unit 160 does not invert the input/output data. If the address analysis indicates that there is an access through the input/output wiring MIODT_1i and that the plate 111 is accessed, the address-data-topology correcting unit 160 does not invert the input/output data. If the address analysis indicates that three is an access through the input/output wiring MIODT_1i and that the plate 112 is accessed, the address-data-topology correcting unit 160 needs to invert the input/output data.

Likewise, input/output terminals of each of sense amplifiers 213 and 215 are connected to a pair of local wirings LIOT_0j and LION_0j, respectively and connected to an input/output wiring MIODT_0j in the crossing area 210. Moreover, input/output terminals of each of sense amplifiers 214 and 216 are connected to a pair of local wirings LIOT_0i and LION_0i, respectively and connected to an input/output wiring MIODT_0i in the crossing area 210.

Figure 4:
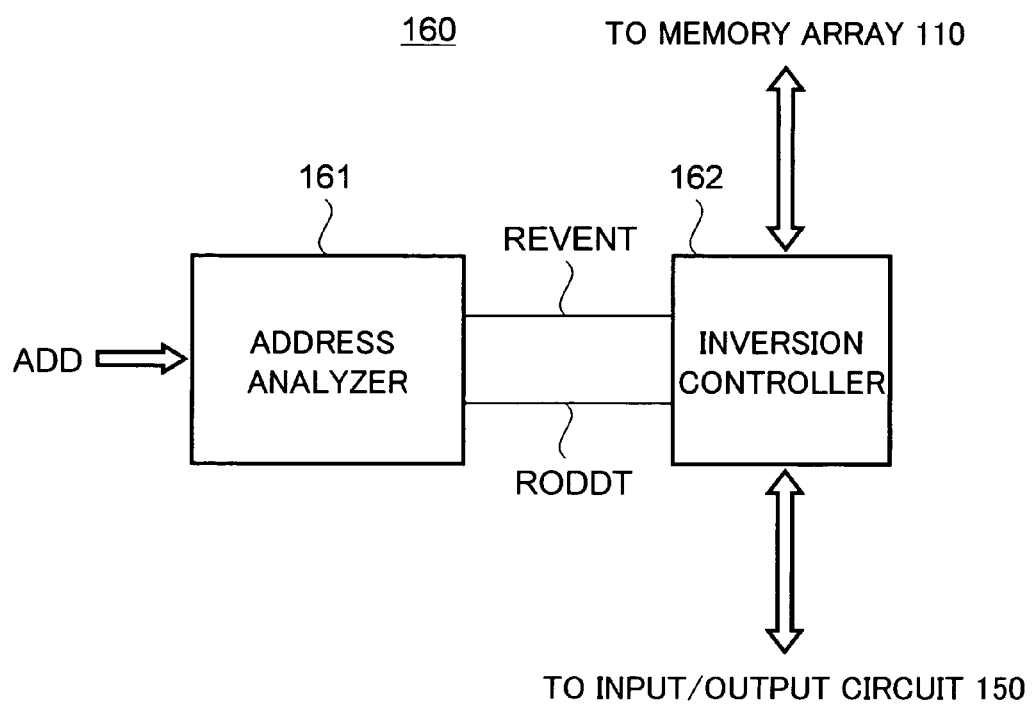
FIG. 4 is a schematic block diagram of the configuration of an address-data-topology correcting unit.

FIG. 4 is a schematic block diagram of the configuration of the address-data-topology correcting unit 160.

As shown in FIG. 4, the address-data-topology correcting unit 160 includes an address analyzer 161 that analyzes which plate is accessed, and an inversion controller 162 controls the input/output data to be inverted or non-inverted based on the analysis result. The address analyzer 161 does not need to determine which of the plural plates is accessed among many plates included in the memory array 110. It suffices that the address analyzer 161 determines whether the plate 111 or 113 is accessed or the plate 112 is accessed among the three plates 111 to 113 constituting each memory mat.

If it is determined that the plate 111 or 113 is accessed, the address analyzer 161 activates a determination signal RODDT. If it is determined that the plate 112 is accessed, the address analyzer 161 activates a determination signal REVENT. The determination signals RODDT and REVENT are supplied to the inversion controller 162.

Figure 5:
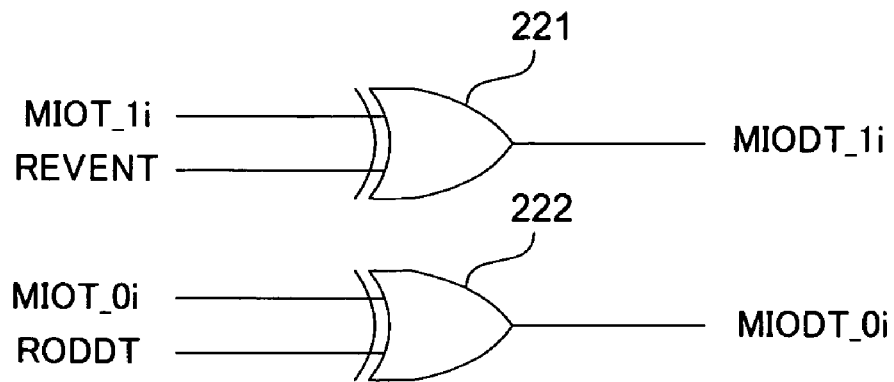
FIG. 5 is a circuit diagram showing relevant parts of the circuits included in an inversion controller and used when data is written.

FIG. 5 is a circuit diagram showing relevant parts of the circuits included in the inversion controller 162 and used when data is written.

As shown in FIG. 5, the inversion controller 162 includes EXOR circuits 221 and 222. The EXOR circuit 221 outputs an exclusive OR between the write data supplied through the input/output wiring MIOT_1i and the determination signal REVENT. The EXOR circuit 222 outputs an exclusive OR between the write data supplied through the input/output wiring MIOT_0i and the determination signal RODDT. As shown in FIG. 3, the input/output wirings MIOT_1i and MIOT_0i are wirings that connect the input/output circuit 150 to the address-data-topology correcting unit 160.

The output of the EXOR circuit 221 is supplied to the input/output wiring MIODT_1i and that of the EXOR circuit 222 is supplied to the input/output wiring MIODT_0i. It is to be noted that such EXOR circuits are not connected between the input/output wirings MIOT_0j and MIODT_0j or between the input/output wirings MIOT_1j and MIODT_1j. Namely, data is not at all inverted between the input/output wirings MIOT_0j and MIODT_0j or between the input/output wirings MIOT_1j and MIODT_1j.

Figure 6:
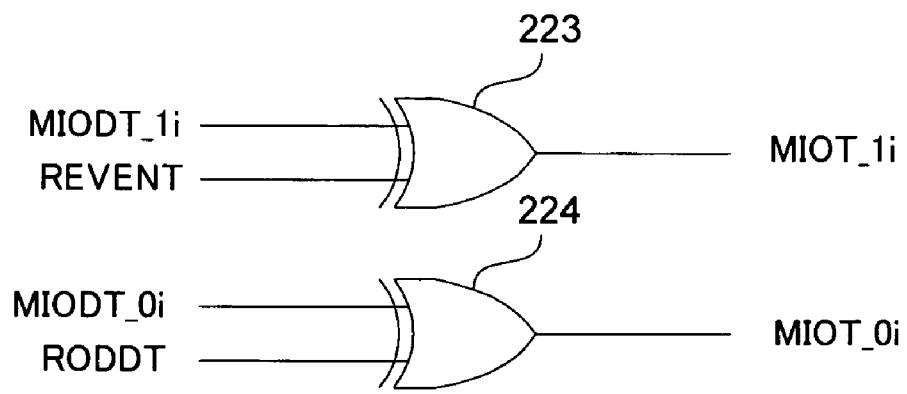
FIG. 6 is a circuit diagram showing relevant parts of the circuits included in the inversion controller and used when data is read.

FIG. 6 is a circuit diagram showing relevant parts of the circuits included in the inversion controller 162 and used when data is read.

As shown in FIG. 6, the inversion controller 162 further includes EXOR circuits 223 and 224. The EXOR circuit 223 outputs an exclusive OR between read data supplied through the input/output wiring MIODT_1i and the determination signal REVENT. The EXOR circuit 224 outputs an exclusive OR between read data supplied through the input/output wiring MIODT_0i and the determination signal RODDT. The output of the EXOR circuit 223 is supplied to the input/output wiring MIOT_1i, and that of the EXOR circuit 224 is supplied to the input/output wiring MIOT_0i.

FIG. 7 is a table for explaining data inverting operation performed by the address-data-topology correcting unit 160.

As shown in FIG. 7, if the determination signal REVENT is activated as a result of control of the EXOR circuits 221 to 224 and data is input or output through the input/output wiring MIOT_1i (MIODT_1i), the address-data-topology correcting unit 160 inverts the data. If the determination signal RODDT is activated as a result of the above control and data is input or output through the input/output wiring MIOT_0i (MIODT_0i), the address-data-topology correcting unit 160 inverts the data. Otherwise, the address-data-topology correcting unit 160 does not invert the data.

With the above configuration, if the memory cell connected to the twisted bit line is accessed, it is possible to exercise control to invert the input or output data. If the memory cell connected to the untwisted bit line is accessed, it is possible to exercise control not to invert the input or output data. As a result, it is possible to make the address data topology appear considerably simple.

As described above, the user does not at all need to recognize the address data topology when the user actually uses the semiconductor memory device. However, it is essential to read and write data by considering the address data topology if the screening test or the like in which it is necessary to recognize the physical level (high level or low level) stored in each memory cell is conducted. In this case, complication of the address data topology is a heavy burden on the tester. Particularly, if the number of word lines allocated to each plate (that is, the number of memory cells connected to each pair of bit lines) is not the $n^{th}$ power of 2 as described in the present embodiment, the address data topology becomes considerably complicated. It is, therefore, highly likely that the conventional tester cannot be used for the screening test or the like.

However, in the semiconductor memory device 100 according to the present embodiment, the address-data-topology correcting unit 160 is used to correct the address data topology in the semiconductor memory device 100. It is, therefore, possible to use the conventional tester as it is and consequently suppress the increase of the manufacturing cost.

The present invention is in no way limited to the aforementioned embodiments, but rather various modifications are possible within the scope of the invention as recited in the claims, and naturally these modifications are included within the scope of the invention.

For example, in the present embodiment, the number of word lines allocated to each plate is not the $n^{th}$ power of 2. However, the present invention is not limited to the embodiment. Namely, the plate, in which the number of allocated word lines is the $n^{th}$ power of 2, can be provided. If the numbers of word lines allocated to all the plates are not the $n^{th}$ power of 2, the address data topology becomes particularly complicated as described in the embodiment. Therefore, the present invention is suited to be applied to such a semiconductor memory device.

In the present embodiment, the numbers of word lines allocated to the adjacent plates differ from each other. However, the present invention is not limited to the embodiment. If the numbers of word lines allocated to the adjacent plates differ from each other, the address data topology becomes particularly complicated as described in the embodiment. Therefore, the present invention is suited to be applied to such a semiconductor memory device.

What is claimed is:

1. A semiconductor memory device comprising:
   a first pair of bit lines including a non-inverted bit line and an inverted bit line that can be selected by a row address in a first range;
   a second pair of bit lines including a non-inverted bit line and an inverted bit line that can be selected by a row address in a second range that is not overlapping the first range;
   a sense amplifier provided to be common to the first pair of bit lines and the second pair of bit lines; and
   an address-data-topology correcting unit supplying write data and outputting read data to/from the first pair of bit lines without inverting and supplying write data and outputting read data to/from the second pair of bit lines with inverting, wherein
   a positional relationship between the non-inverted bit line and the inverted bit line in the first pair of bit lines is opposite to a positional relationship between the non-inverted bit line and the inverted bit line in the second pair of bit lines.

2. The semiconductor memory device as claimed in claim 1, wherein at least one of the number of memory cells connected to the first pair of bit lines and the number of memory cells connected to the second pair of bit lines differs from the number expressed by the $n^{th}$ power of 2.

3. The semiconductor memory device as claimed in claim 2, wherein both the number of memory cells connected to the first pair of bit lines and the number of memory cells connected to the second pair of bit lines differ from the number expressed by the $n^{th}$ power of 2.

4. The semiconductor memory device as claimed in claim 1, wherein the number of memory cells connected to the first pair of bit lines differs from the number of memory cells connected to the second pair of bit lines.

5. The semiconductor memory device as claimed in claim 1, wherein a lowest row address of a memory cell among memory cells connected to the first pair of bit lines differs from a lowest row address of a memory cell among memory cells connected to the second pair of bit lines in a logic value by two bits or more.

6. The semiconductor memory device as claimed in claim 1, wherein the first pair of bit lines and the second pair of bit lines belong to different plates from each other.

* * * * *